United States Patent [19]
Pai et al.

[11] Patent Number: 5,312,536
[45] Date of Patent: May 17, 1994

[54] METHOD AND APPARATUS TO EVALUATE EFFECTIVENESS OF CLEANING SYSTEMS FOR HIGH DENSITY ELECTRONICS

[75] Inventors: Deepak K. Pai, Burnsville; Gene A. Maday, Spring Lake Park, both of Minn.

[73] Assignee: Ceridian Corporation, Bloomington, Minn.

[21] Appl. No.: 935,034

[22] Filed: Aug. 25, 1992

[51] Int. Cl.$^5$ ............................................. G01N 27/26
[52] U.S. Cl. ........................... 204/401; 204/400; 204/416; 204/153.1
[58] Field of Search ............ 204/400, 401, 153.1, 204/416

[56] References Cited

U.S. PATENT DOCUMENTS

| | | | |
|---|---|---|---|
| 4,165,270 | 8/1979 | Ost et al. | 204/401 |
| 4,456,515 | 6/1984 | Krueger et al. | 204/192 |
| 4,604,144 | 8/1986 | Wong | 134/28 |
| 4,905,371 | 6/1990 | Pai | 29/840 |
| 4,939,469 | 7/1990 | Ludwig et al. | 324/694 |
| 5,006,212 | 4/1991 | DiSanto et al. | 204/192 |
| 5,084,961 | 1/1992 | Yoshikawa | 29/840 |
| 5,110,662 | 5/1992 | Depauw et al. | 428/192 |

OTHER PUBLICATIONS

*A Comparison of CFC Alternatives Assessment Programs*, Colin Lea, Journal of SMT, Apr. 1992, pp. 4-15.

Primary Examiner—John Niebling
Assistant Examiner—Bruce F. Bell
Attorney, Agent, or Firm—Kinney & Lange

[57] ABSTRACT

An apparatus and method for a cleaning process control is disclosed. The apparatus includes two parallel plates of glass that have a plurality of shims positioned therebetween and a means for clamping these plates of glass firmly against the shims. A contaminant is positioned between the plates of glass and the apparatus is cleaned using a selected cleaning process. The apparatus can then be inspected to determine the effectiveness of a particular cleaning process by peering through the transparent glass plates to inspect for any remaining contaminant. The apparatus can then be cleaned more extensively and used again to check a different cleaning process.

16 Claims, 3 Drawing Sheets

METHOD AND APPARATUS TO EVALUATE EFFECTIVENESS OF CLEANING SYSTEMS FOR HIGH DENSITY ELECTRONICS

BACKGROUND OF THE INVENTION

The present invention relates to cleaning processes that are used to remove residue from soldering components to printed wiring boards. More particularly, the present invention relates to an apparatus and method for evaluating the effectiveness of a selected cleaning process for cleaning printed circuit boards after the soldering process is complete. The manufacture of circuit card assemblies includes the step of adding separately manufactured component parts to the printed circuit board or printed wiring board (PWB). These component parts such as leadless ceramic chip carriers are often attached to the printed circuit board with an adhesive and then soldered to the printed circuit board. The component parts together with the printed circuit board form a circuit card assembly that is usually cleaned after the soldering process to remove excess solder and solder flux used to treat both the components and the printed wiring board for soldering. Failure to properly clean the printed circuit card assembly can result in solder shorts between the component leads and corrosion, both of which can cause long-term reliability problems.

Corrosion may occur if the circuit card assembly is not thoroughly cleaned. The flux used in the soldering process normally contain organic acids and activators containing halides. If the cleaning process is not adequate, traces of the chlorine, fluorine or bromine will be left along with the cleaning fluid. The introduction of moisture to an improperly-cleaned circuit card assembly can result in corrosion. Moisture may be introduced to the circuit card assembly in a variety of ways including humidity of the surrounding environment or condensation resulting from extreme temperature change.

Manufacturers of military electronics are often required to use specified fluxes during soldering operations such as rosin-based R or RMA fluxes. The removal of rosin-based R or RMA fluxes requires that the cleaning system make use of a solvent based on CFC-113 and methyl-chloroform. However, for environmental reasons manufacturers of military electronics have been either encouraged or required to make use of alternate solvents that do not contain chlorofluoro-hydrocarbons (CFC). Therefore, experimentation with cleaning solvents that do not contain CFC's is necessary so that alternate cleaning solutions may be identified and evaluated.

In addition to environmental concerns, experimentation with cleaning processes and cleaning solvents are often conducted to maximize the reliability of the completed circuit card assembly. Experimentation with the cleaning process is particularly important if changes are made to the circuit card assembly. These changes may involve the incorporation of newer technologies such as new electrical components that tend to have larger packages having larger numbers of leads and also fine pitch leads. Other changes to the circuit card assembly that may require adjustments to the cleaning process include new adhesives for attaching components and new solder fluxes for component cleaning. Therefore, to maximize the reliability of the completed circuit card assembly, experimentation is necessary with various cleaning processes and cleaning solutions so that excess solder or solder balls are eliminated, and corrosion is eliminated or minimized.

A known method for cleaning process control is described in U.S. Pat. No. 4,905,371 to Pai and assigned to the assignee of the present invention and incorporated herein by reference. Pai discloses the attachment of electrical components to a glass printed wiring board using a conventional soldering process. After attaching the components to the printed wire circuit board, the printed wire circuit board is cleaned using a selected process. Once the assembly and cleaning are completed, the effectiveness of the cleaning process is determined by visual inspection by peering through the glass printed wire board. The component is then desoldered from the glass printed wiring board and the adhesive is removed with a solvent. The components may be re-used approximately ten times.

There is an ever present need for improved methods and apparatus by which the cleaning processes of the circuit card assembly can be tested in a cost-effective manner to determine the effectiveness of the cleaning process and to evaluate various cleaning solutions.

SUMMARY OF THE INVENTION

The present invention is a method and apparatus for evaluating the effectiveness of a selected cleaning process used to remove residue from the process of soldering components to printed wiring boards. The apparatus includes first and second members, each of which have a planar surface. At least one of the first member or the second member is substantially transparent. Included is a spacing means that is positioned between a portion of the planar surfaces of each of the first and second members for maintaining a selected separation therebetween. Also included is a clamping means that engages each of the first and second members opposite the planar surface for maintaining the planar surfaces of the first and second members in engagement with the spacing means.

The method of the present invention is used to evaluate the effectiveness of a selected cleaning process and cleaner used to remove residue resulting from solder connection of components to printed wiring board. The method of the present invention includes placing a residue on the planar surface of at least one of the first and second members. The method further includes positioning a spacing means between a portion of the planar surface areas of each of the first and second members. Clamping each of the first and second members together using a clamping means so that the planar surfaces of the first and second members are in engagement with the spacing means. Cleaning the assembly of first and second members using the selected cleaning process. Inspecting the first and second members for residue positioned therebetween by viewing through the transparent portion thereof.

DETAILED DESCRIPTION OF THE PREFERRED EMBODIMENTS

Figure 1:
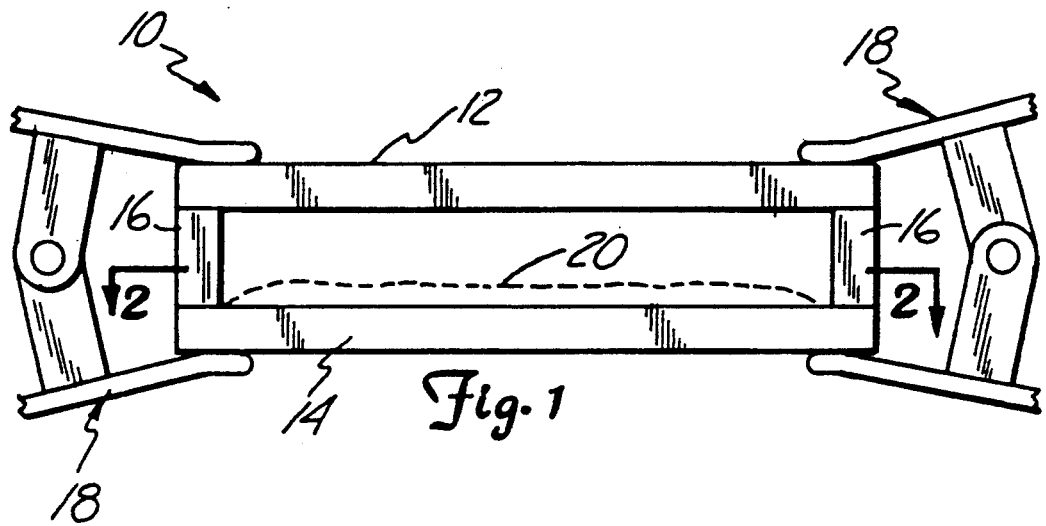
FIG. 1 is a side elevational view of the test vehicle of the present invention with an outline of a contaminant shown in dashed lines.

Shown in FIG. 1 is a test vehicle 10 for evaluating the effectiveness of a selected cleaning process used to remove residue from soldering components to printed wiring boards. The test vehicle 10 includes a first member 12, a second member 14, spacing means 16 and clamping means 18. A contaminant 20 representing residue of a soldering operation may be placed between each of the planar surfaces of the first member 12 and the second member 14.

Figure 2:
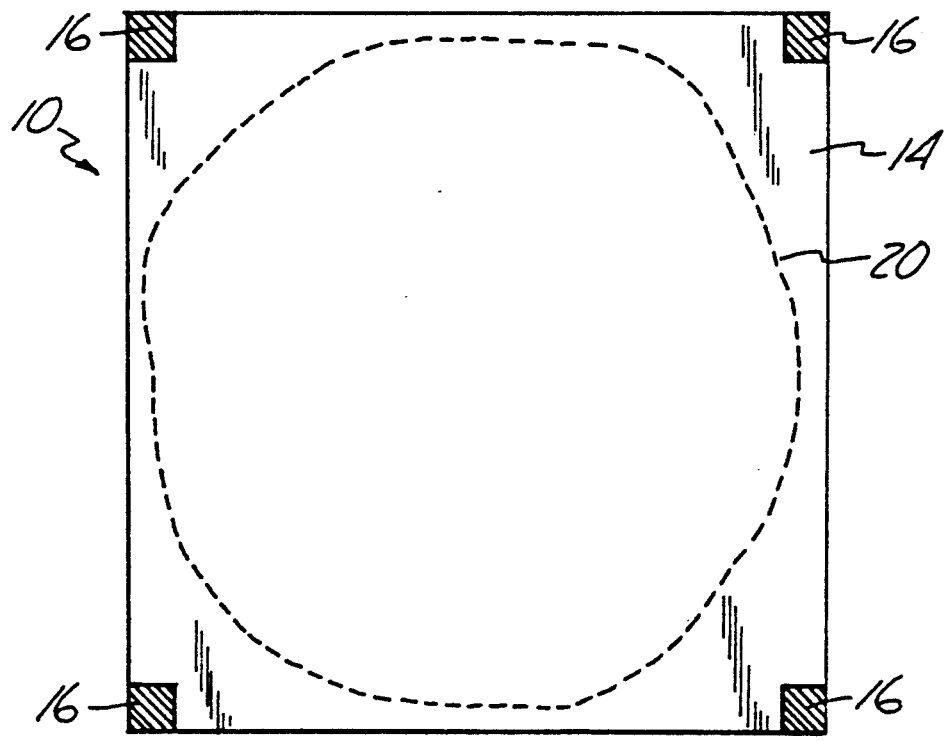
FIG. 2 is a top elevational view of the test vehicle shown in FIG. 1 taken in section along line 2—2 with the outline of the contaminant shown in dashed lines.

FIG. 2 shows a top elevational view shown in section taken along line 2—2 of the test vehicle 10 of FIG. 1. The first member 12 and the second member 14 each have planar surfaces that are positioned in opposition. At least one of the first member 12 or the second member 14 is transparent. In one preferred embodiment the first member 12 as well as the second member 14 are rectangular plates of glass.

The spacing means 16 is positioned between a portion of the planar surfaces of each of the first member 12 and the second member 14. The spacing means 16 maintains a selected separation between the planar surfaces of each of the first and second members 12 and 14, respectively. In one preferred embodiment spacing means 16 are shims that are positioned between the planar surfaces and at each of the corners of the first member 12 and the second member 14. These shims may be selected to provide a separation between the planar surfaces of each of the first member 12 and the second member 14 that is in a range from 0.001 to 0.060 inches.

The manufacture of circuit card assemblies includes the step of soldering component parts to the printed wiring board. As a result of this soldering process solder and solder flux may flow, among other places, between the printed wiring board and one or more of the component parts. The residue of the soldering process can affect the reliability of the circuit card assembly. For example, the excess solder may form undesired electrical connections between adjacent component leads or conductive traces on the printed wiring board. In addition, solder flux on the components or printed wiring board may cause corrosion that can cause long-term reliability problems. Therefore, to maximize the reliability of the circuit card assembly the region between the components and the printed wiring board must be properly cleaned.

The spacing between the planar surfaces of each of the first member 12 and the second member 14 that is defined by the spacing means 16 is representative of the space between the printed wiring board and the components soldered thereto to form the circuit card assembly. Therefore, the ability of a selected cleaning process to remove the residue of the soldering process from the region between the components and the printed wiring board may be evaluated based on the ability of the selected cleaning process to remove the contaminant placed between the first and second members, 12 and 14, respectively, for the test vehicle 10.

The clamping means 18 engages each of the first member 12 and the second member 18 opposite the planar surface for maintaining the planar surfaces in engagement with the spacing means 16. The clamping means 18 may be a spring-biased clip as shown or any other form of conventional clamping device for applying a force to each of the first and second members 12 and 14 respectively to prevent the spacing means 16 from changing position. In one preferred embodiment clamping means 18 is four spring clips that are each positioned at the corners of both the first member 12 and the second member 14. Four shims positioned between the planar surfaces of first member 12 and second member 14 proximate to each of the four spring clamps are included in this preferred embodiment.

Figure 3:
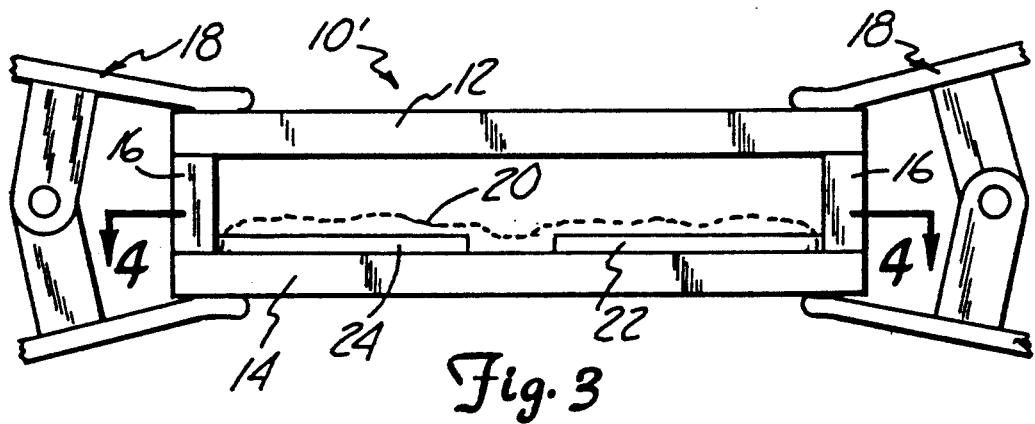
FIG. 3 is a side elevational view of the test vehicle of the present invention shown with electrical conductors and with the outline of the contaminant shown in dashed lines.
Figure 4:
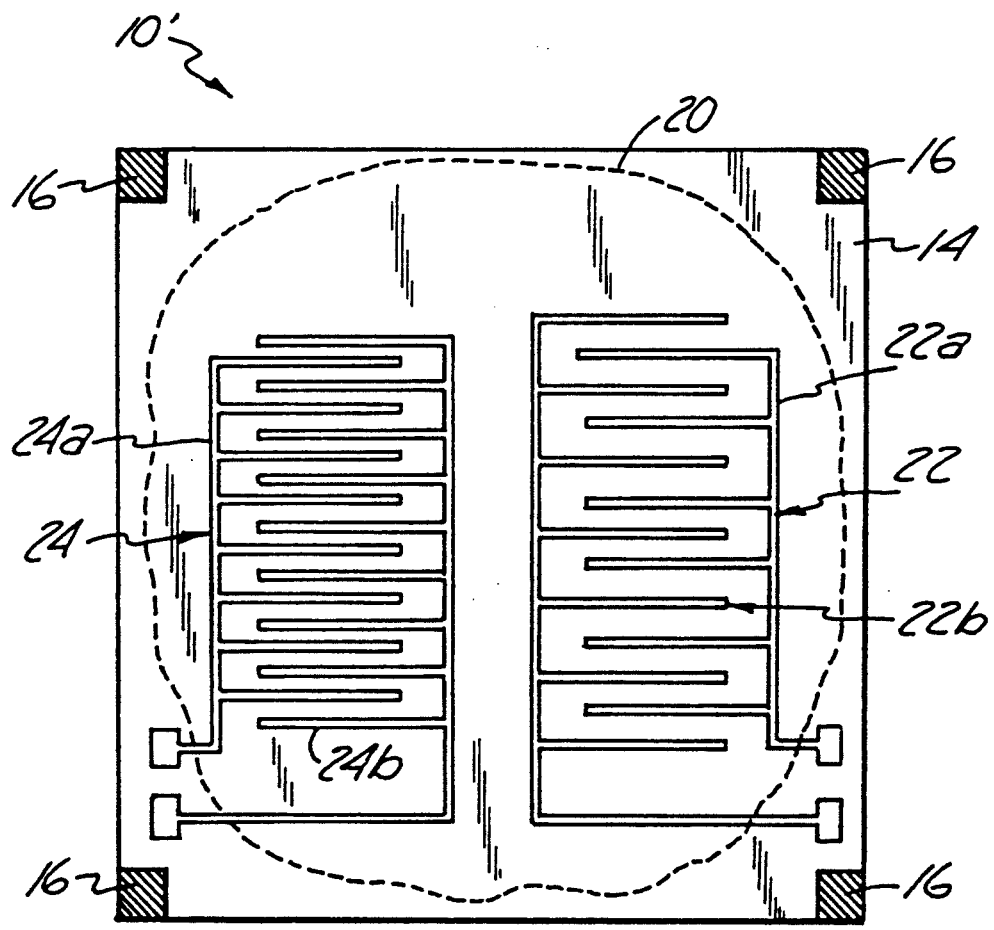
FIG. 4 shows a top elevational view of the test vehicle shown in FIG. 3 taken in section along line 4—4 with the outline of the contaminant shown in dashed lines.

FIG. 3 and 4 show the test vehicle 10' for use in humidity testing to evaluate the effectiveness of a selected cleaning process used to remove residue from soldering components to printed wiring boards. Test vehicle 10' is similar to test vehicle 10 and therefore similar numbering is used in FIGS. 3 and 4 to identify structures that are similar to those in FIGS. 1 and 2. The test vehicle 10' includes a first member 12, a second member 14, a spacing means 16, a clamping means 18, and a contaminant 20, all of which are identical to test vehicle 10 shown in FIGS. 1 and 2. Test vehicle 10' includes a conductive pattern 22 and a conductive pattern 24 that are not shown in test vehicle 10.

FIG. 4 shows a top plan view in section of the test vehicle 10' shown in FIG. 3 taken along line 4—4. As shown in FIG. 4, the conductive patterns 22 and 24 are each a pair of comb-shaped conductive patterns 22a, 22b, 24a, 24b that are positioned in opposition with the fingers of each of the comb-shaped pattern 22a, 24a intertwined with the matching pattern 22b, 24b. Comb-shaped conductive patterns are known and are used for determining the presence of certain residues such as electrolytes or salts on the circuit card assembly after the cleaning process is complete. These comb-shaped conductive patterns are frequently positioned between a component and the printed wiring board on the circuit card assembly to determine the effectiveness of the cleaning process in the removal of salts and electrolytes.

These conductive patterns 22 and 24 when immersed in an electrolyte solution or molten salts and connected to a constant polarity voltage bias causes electrolysis to occur. The comb pattern, such as patterns 22a and 24a, connected to the negative voltage supply causes a reduction reaction that is a reaction in which electrons are consumed and that the comb pattern, such as patterns 22b, 24b, that is connected to the positive voltage supply and oxidation reaction occurs. Electrolysis is identified either by visual inspection, or by detecting a current flow between each half of the comb pattern. In this manner, the detection of electrolysis may be used to identify the presence of an electrolyte or salt as a residue of the cleaning process.

The contaminant 20, the outline of which is shown in dotted lines in FIGS. 3 and 4 may be applied to test vehicle 10'. As shown in FIG. 3, the residue 20 is applied on top of the conductive patterns 22 and 24. In this manner, humidity testing may be performed to determine if there are any electrolytes or salts that remain after a cleaning process is performed on test vehicle 10'.

Figure 5:
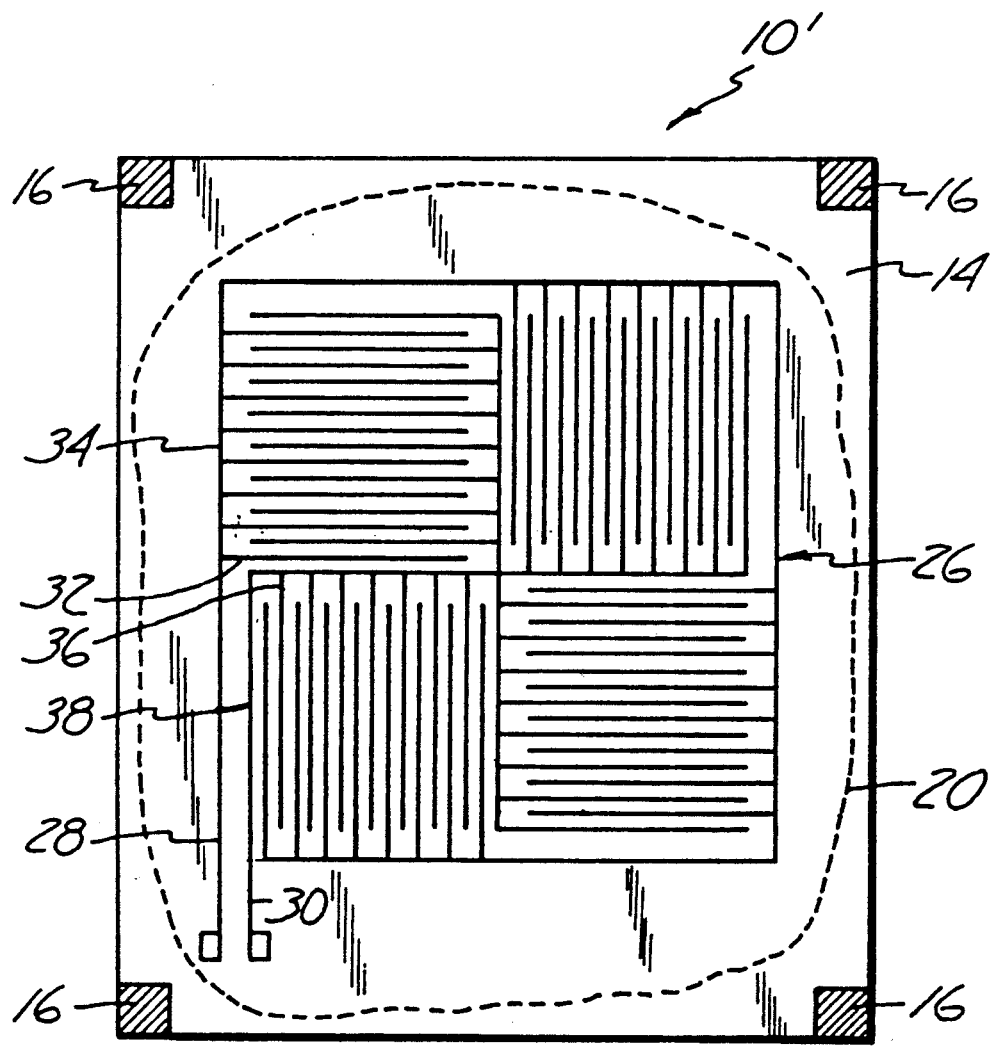
FIG. 5 shows a top elevational view of the test vehicle of the present invention as in FIG. 4 shown with an alternate embodiment of the electrical conductors and with the outline of the contaminant shown in dashed lines.

FIG. 5 shows an alternate embodiment 26 of the conductive patterns 22 and 24 shown in FIGS. 3 and 4. The conductive pattern 26 includes a first conductor 28 and a second conductor 30, each of which is electrically isolated from each other. The first conductor 28 has a plurality of finger-like conducting portions 32 extending from a connecting or routing portion 34 with each of the finger-like conducting portions 32 being substantially perpendicular to the routing portion 34. The routing portion 34 of the first conductor 28 is routed so that each of the finger-like conducting portions 32 of a first portion of the plurality extend parallel to one another in a first direction with a second portion of the plurality of finger-like conducting portions extending in a second direction offset 90 degrees from the first direction. A third portion of the plurality of finger-like conducting portions extend in a third direction that is offset 90 degrees from the second direction and a fourth portion of the finger-like conducting portions extend in a fourth direction that is offset 90 degrees from the third direction. In this manner, the first conductor 28 forms a series of comb-like patterns that are electrically connected to one another and are oriented in a direction 90 degrees from the adjacent comb-like patterns.

The second conductor 30 includes a plurality of finger-like conducting portions 36 extending in a perpendicular direction from a routing portion 38. The routing portion 38 of the second conductor 30 is routed so that a portion of the plurality of finger-like conducting portions 36 are spaced apart in a parallel interleaved orientation for each of the first, second, third, and fourth portions of the plurality of spaced-apart, finger-like conducting portions 32 of the first conductor 28.

The arrangement of the first conductor 28 and the second conductor 30 shown in FIG. 5 has several advantages over either conductive pattern 22 or conductive pattern 24 shown in FIG. 4. The conductive pattern 26 shown in FIG. 5 incorporates four interleaved comb-like patterns that are all formed from a single pair of conductors, therefore, the conductive pattern 26 requires a single direct current bias source instead of four bias sources that would be required if the conductive patterns 22 or 24 were arranged in a similar manner. In addition, the conductive pattern 26 is more compact than the use of four of the conductive patterns 22 or 24 that are offset in a similar manner.

The conductive pattern 26 may also be used to detect the presence of electrolytes or salts that remain on the circuit card assembly or the test vehicle in a manner similar to the conductive patterns 22 or 24. Cleaning systems frequently make use of directional sprays of either cleaning solution or rinsing solutions that are directed towards either the circuit card assembly or the test vehicle. Therefore, it is important that the conductive pattern used in either the test vehicle or on the circuit card assembly for detecting the presence of electrolytes or salts be oriented in more than one direction so that the effectiveness of the cleaning system in each direction can be determined.

Because the conductive pattern 26 is compact this pattern can is easily positioned between a component on the circuit card assembly and the printed wiring board. In addition, because the conductive pattern 26 has portions thereof oriented in four directions and because the conductive pattern has a finite thickness a labyrinth is formed by the conductive pattern 26. This labyrinth tends to trap electrolytes or salts that are positioned therein. Therefore, the conductive pattern 26 can be used to determine the effectiveness of the cleaning system to access this trapped residue from different directions or orientations in order to remove this residue.

In operation, the test vehicle 10 or 10' is disassembled by removing the clamping means 18 and separating the first member 12 from the second member 14. A known contaminant is placed on the planar surface of the second member 14 for test vehicle 10 and on the conductive patterns 22 and 24 or 26 or test vehicle 10'. The contaminant 20 used may be representative of those chemicals or compounds that are present on the circuit card assembly after the soldering operation or some form of tracer whose presence is readily detected. In one preferred embodiment the contaminant 20 may include one or more of the following: Solder flux, ultraviolet tracer, or sodium chloride (NaCl).

After the contaminant 20 is placed in the test vehicle 10 or 10' the test vehicle is reassembled by first repositioning the spacer means 16 and then placing the first member 12 so that the spacing means 16 are position between each of the planar surfaces of the first member 12 and the second member 14. The spacing means 16 simulate the spacing between the components and the printed wiring board of the circuit card assembly. The appropriate spacing means is selected to evaluate the effectiveness of a selected cleaning process for cleaning a selected circuit card assembly. The clamping means 18 are positioned to engage each of the first member 12 and the second member 14 so that the first member 12, the spacing means 16 and the second member 14 are all held firmly together.

The test vehicle 10 or 10' for cleaning is then placed in a selected cleaning system and cleaned, following a prescribed cleaning process. The test vehicle 10 or 10' of the present invention is suitable for a variety of cleaning systems that are presently used.

After cleaning the test vehicle 10 or 10' is then visually inspected through the transparent members 12 or 14 for traces of the contaminant or of the cleaning process. The visual inspection may be aided by known optical magnification techniques thereby magnifying the test vehicle 10 or 10'. In a preferred embodiment the test vehicle 10 or 10' is magnified by 100 times using optical magnification to aid in visual inspection. In addition, the test vehicle may be inspected under various lighting such as ultraviolet light or polarized light, each of which being effective for identifying certain kinds of contaminants on the test vehicle 10 or 10'. Clamping means 18 may be removed allowing the first member 12 to be separated from the test vehicle 10 or 10' to aid in the visual inspection.

The cleaning process can then be adjusted to more effectively remove any remaining contaminant that is identified in the test vehicle or any residue of the cleaning process. The test vehicle 10 or 10' may then be reused by repeating the same process to then reevaluate the cleaning process.

An additional test may be performed for determining the presence of electrolytes or salts that are remnants of the contaminant or a residue of the cleaning process that are present on the test vehicle 10'. In one preferred test, the test vehicle 10' is placed in a humid environment such as the humidity test specified in commonly used military testing requirement MIL-STD-883, Method 1004. In this test, the test vehicle 10' is exposed to a humid environment and a direct current electric bias is applied to the conductive patterns 22, 24 or 26. The humid environment provides a solution for the electrolytes and salt so that an electrolysis reaction can occur.

The test vehicle 10' is then visually inspected to identify corrosion occurring as a result of electrolysis. The presence of corrosion is indicative of the presence of electrolytes or salts that may be a result of the contaminant 20 that was not completely removed by the cleaning process or that was added or a residue of the cleaning process itself. Other tests that may be used to detect the presence of electrolytes or salts are resistant measurements between each of the spaced electrical conductors. For this test, a decrease in resistance is indicative of the presence of electrolytes or salts which provide a conductive path between the electrically-isolated conductors 22, 24 or 26. Alternatively, the electrolysis reaction causes a current to flow between the electrically-isolated electrical conductors which can be measured indicating the presence of electrolytes or salts. Both the resistance measuring technique and the current measuring technique for detecting an electrolysis reaction are known.

The presence of electrolytes or salts that are within the test vehicle 10' are indicative that the cleaning process being evaluated is not effective. After adjustments are made to the cleaning process to eliminate these electrolytes or salts the process previously described may be repeated to evaluate the effectiveness of the cleaning process.

The test vehicle of the present invention as well as the process for using the test vehicle provides a cost-effective way for evaluating the effectiveness of a selected cleaning system. The test vehicle of the present invention is also suited for use with testing methods for evaluating the effectiveness of a cleaning system to remove electrolytes and salts from the circuit card assembly.

Although the present invention has been described with reference to preferred embodiments, workers skilled in the art will recognize that changes may be made in form and detail without departing from the spirit and scope of the invention.

What is claimed is:

1. A device for testing a selected cleaning process and cleaner used to remove residue resulting from solder connection of components to printed wiring boards, the device comprising:
   first and second members each of which having a planar surface with at least one of the first and second members being transparent;
   spacing means positioned between a portion of the planar surfaces of each of the first and second members for maintaining a selected separation therebetween;
   means which provides an electric field between the planar surfaces for promoting electrolysis in the presence of electrolytes in solution; and
   clamping means engaging each of the first and second members opposite the planar surfaces for maintaining the planar surfaces of the first and second members in engagement with the spacing means, the planar surface of at least one of the first and second members being disposed and arranged to support material constituting the residue, the clamping means and spacing means being disposed and arranged to allow opposing planar surfaces atmospheric exposure.

2. The device of claim 1 wherein the first and second members are glass plates.

3. The device of claim 1 wherein the spacing means is a plurality of shims spaced about a perimeter of the first and second members.

4. The device of claim 1 wherein the clamping means is a spring clip that applies a force to the first and second members to maintain the planar surfaces of each of the first and second members in engagement with the spacing means.

5. The device of claim 1 wherein the means which provides an electric field includes first and second spaced apart electrical conductors positioned on at least a portion of the planar surface of at least one of the first and second members with the first and second spaced apart electrical conductors configured for connection to a voltage supply.

6. An apparatus for testing a selected cleaning process and cleaner comprising:
   a transparent plate;
   a pattern of electrically conductive material positioned proximate the transparent plate having a first and second terminal configured for connection to a constant polarity electromotive force for promoting electrolysis in the presence of one of electrolytes in solution or molten salts, the pattern comprising:
      a plurality of first spaced apart electrical conductors electrically connected to the first terminal, the plurality of first electrical conductors having a plurality of orientations; and
      a plurality of second spaced apart electrical conductors electrically connected to the second terminal, and interleaved with the plurality of first electrical conductors is the plurality of second electrical conductors.

7. The device of claim 6 wherein the first spaced apart electrical conductor further includes a plurality of first electrical conductors and the second spaced apart electrical conductor further includes a plurality of second electrical conductors spaced apart in an interleaved orientation with the plurality of first electrical conductors the plurality of first and second electrical conductors being supported on a planar surface of at least one of the first and second members.

8. The device of claim 7 wherein the plurality of first electrical conductors includes a portion thereof having a first orientation and a second portion thereof having a second orientation perpendicular to the first orientation and wherein the plurality of second electrical conductors includes a first portion thereof parallel to the first orientation and a second portion thereof parallel to the second orientation.

9. The apparatus of claim 6 wherein the plurality of first spaced apart electrical conductors includes:
   a first portion in a spaced apart parallel orientation; and
   a second portion in a spaced apart parallel orientation with the first portion being perpendicular to the second portion;
   and wherein the plurality of second spaced apart electrical conductors includes:
   a third portion spaced apart in a parallel interleaved orientation with the first portion; and
   a forth portion spaced apart in a parallel interleaved orientation with the second portion.

10. The apparatus of claim 6 wherein the plate is a glass plate.

11. The apparatus of claim 6 wherein the plate is a printed wiring board.

12. The device of claim 7 wherein the plurality of first electrical conductors as well as the plurality of second electrical conductors have a plurality of orientations.

13. The device of claim 7 wherein at least one of the plurality of first electrical conductors and at least one of the plurality of second electrical conductors are positioned parallel to one another.

14. A method for testing a selected cleaning process and cleaner used to remove residue resulting from solder connection of components to printed wiring boards, the method comprising:
    providing a transparent member having a planar surface having a first electrical conductor spaced from a second electrical conductor;
    placing a residue on the planar surface of the transparent member;
    cleaning the transparent member using the selected cleaning process;
    applying an electromotive force to the first and second electrical conductors to generate an electric field which promotes electrolysis in electrolytes in solution; and
    inspecting the transparent member for corrosion by viewing through the transparent member thereof.

15. The method of testing a selected cleaning process of claim 14, the method further comprising:
    placing the transparent member in an environment which introduces moisture for a selected amount of time.

16. The method for testing a selected cleaning process of claim 14 further including:
    providing a second transparent member having a planar surface;
    positioning a spacing means between a portion of the planar surface areas of each of the transparent members; and
    clamping each of the transparent members together so that the planar surfaces of each of the transparent members are in engagement with the spacing means.

* * * * *

UNITED STATES PATENT AND TRADEMARK OFFICE
CERTIFICATE OF CORRECTION

PATENT NO. : 5,312,536

DATED : May 17, 1994

INVENTOR(S) : DEEPAK K. PAI, GENE A. MADAY

It is certified that error appears in the above-indentified patent and that said Letters Patent is hereby corrected as shown below:

Col. 3, line 43, delete "0.060 inches", insert --0.050 inches--

Col. 8, line 35, delete "claim 6", insert --claim 5--

Signed and Sealed this

First Day of November, 1994

Attest:

BRUCE LEHMAN

*Attesting Officer*  *Commissioner of Patents and Trademarks*